United States Patent [19]
Hwang

[11] Patent Number: 6,063,529
[45] Date of Patent: May 16, 2000

[54] OVERLAY ACCURACY MEASUREMENT MARK

[75] Inventor: Joon Hwang, Chungcheongbuk-do, Rep. of Korea

[73] Assignee: Hyundai Electronics Industries Co., Ltd., Kyoungki-do, Rep. of Korea

[21] Appl. No.: 09/346,209

[22] Filed: Jul. 1, 1999

Related U.S. Application Data

[62] Division of application No. 08/960,467, Oct. 29, 1997.

[30] Foreign Application Priority Data

Oct. 29, 1996 [KR] Rep. of Korea ............... 96-49832

[51] Int. Cl.[7] ............................................. G03F 9/00
[52] U.S. Cl. ........................... 430/22; 430/5; 438/975
[58] Field of Search ..................... 430/5, 22; 438/975

[56] References Cited

U.S. PATENT DOCUMENTS

| | | | |
|---|---|---|---|
| 5,498,500 | 3/1996 | Bae | 430/22 |
| 5,665,495 | 9/1997 | Hwang | 430/5 |

FOREIGN PATENT DOCUMENTS

| | | |
|---|---|---|
| 59-208723 | 11/1984 | Japan . |
| 62-205623 | 9/1987 | Japan . |

*Primary Examiner*—Christopher G. Young
*Attorney, Agent, or Firm*—Ware, Fressola, Van Der Sluys & Adolphson LLP

[57] ABSTRACT

Disclosed is an overlay accuracy measurement mark used in measuring an overlay accuracy between any two selected device patterns in a semiconductor device having two or more multi-patterns. The mark is applied to a semiconductor device comprising a first pattern which is first formed, and second patterns consisting of at least one or more target patterns for alignment with the first pattern, which are formed after the formation of the first pattern. The mark includes a first overlay measurement pattern consisting of a plurality of unit measurement marks, each having a tetragonal through hole in its central portion, the unit measurement marks being spaced by a selected distance from each other; and a second overlay measurement pattern of a box-shape mark formed within the through of the innermost unit measurement mark of the unit measurement marks, wherein each unit measurement mark of the first and second overlay measurement patterns respectively corresponds to the first and second patterns of the semiconductor device.

9 Claims, 7 Drawing Sheets

OVERLAY ACCURACY MEASUREMENT MARK

CROSS REFERENCE TO RELATED APPLICATION

The present application is a divisional of U.S. Ser. No. 08/960,467 filed Oct. 29, 1997 from which priority is claimed under 35 U.S.C. § 119 and 35 U.S.C. § 120.

BACKGROUND OF THE INVENTION

1. Field of the Invention

The present invention generally relates to an overlay accuracy measurement mark and a method of measuring an overlay accuracy between two selected patterns in a semiconductor device having two or more multi-patterns.

2. Brief Description of the Related Art

An overlay accuracy is known as an index showing an alignment state between multi-patterns, which is respectively formed during a step for forming one pattern and subsequent steps for forming another patterns. The index is measured using a pattern called as a box in box vernier pattern, which is formed on a scribe line separating a wafer to respective dies. The overlay accuracy is influenced by errors generated during the fabrication of a mask used in forming a pattern and of an overlay accuracy measurement system, and acts as an important factor for the alignment between two patterns.

Figure 1:
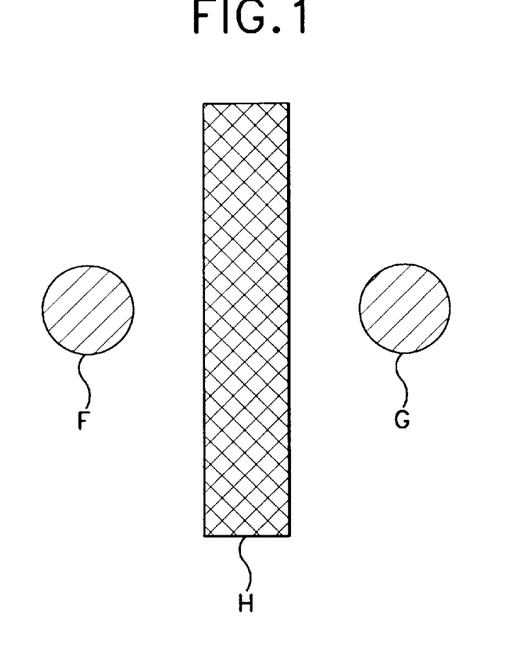
FIG. 1 is a partial plan view of a semiconductor device with two patterns which require an overlay accuracy measurement.
Figure 2:
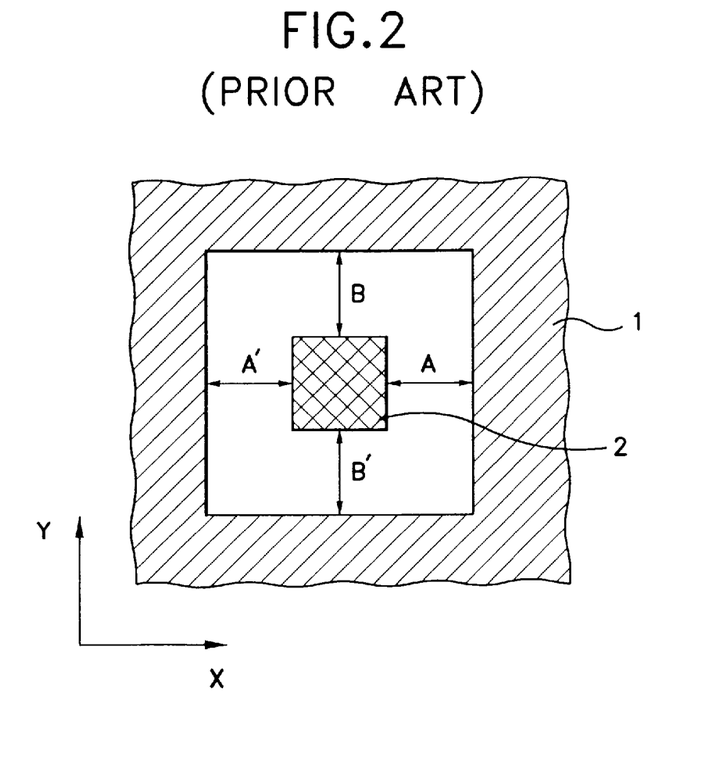
FIG. 2 is a plan view of an overlay accuracy measurement mark for measuring an overlay accuracy between two patterns in FIG. 1.

FIG. 1 is a plan view schematically showing two patterns formed in a semiconductor substrate, and symbol H designates conductive region and symbols F and G designate contact regions. FIG. 2 shows a box in box vernier pattern of an overlay measurement mark for measuring an alignment state between two patterns. The overlay measurement mark is formed on a scribe line of a wafer using a plurality of masks which are identical to those used in the formation of patterns on a product die of the wafer.

Referring to FIGS. 1 and 2, in order to measure an overlay accuracy between two patterns shown in FIG. 1, a box shaped outer overlay mark 1 corresponding to the conductive region H of FIG. 1, is formed on the scribe line by a pattern mask used in the formation of the conductive region H. The mark 1 is formed concurrently with the formation of the conductive region and has a box shaped through hole in its central portion as viewed from top of the mark 1. Thereafter, a box-shaped inner overlay mark 2 corresponding to the contact regions F and G, is formed within the through hole of the outer overlay mark 1.

The overlay accuracy between the conductive region H and the contact regions F and G is measured from distances between two marks 1 and 2. Distances A and A' between the two marks 1 and 2 are measured as a degree of overlay in the X-axis, and the difference A–A' between the two distances is taken as an overlay error in the X-axis. Similarly, distances B and B' between the two marks 1 and 2 are measured as a degree of overlay in the Y-axis, and the difference B–B' between the two distances is taken as an overlay error in the Y-axis.

From the differences A–A' and B–B' obtained respectively in the X-direction and Y-direction, an alignment state between two patterns of FIG. 1 is determined. For example, if the differences A–A' and B–B' are both zero, it indicates that the two patterns H, and F and G are in exact alignment state. If the difference A–A' is positive, and B–B' is positive, it indicates that the contact regions F and G corresponding to the inner overlay mark 2 are shifted to positive X-direction and positive Y-direction by respective selected distances. If the differences A–A' is positive and B–B' is negative, it indicates that the contact regions F and G are shifted to positive X-direction and negative Y-direction by respective selected distances.

However, the above described overlay accuracy measurement mark can measure only the overlay error between selected two patterns. Therefore, to measure the overlay errors between any two selected patterns of three or more patterns which are formed on the product die, there should be additionally provided the same overlay accuracy measurement mark as that shown in FIG. 2. Also, the additional overlay measurement mark must be formed in a separate position from the previously formed overlay accuracy measurement mark on the scribe line. Moreover, several measurements are required depending on the number of patterns for which the overlay errors are to be measured. Furthermore, additional space is required because the additional overlay measurement marks must be placed in places other than the place where the measurement marks for measuring the overlay error between the other two patterns were formed.

SUMMARY OF THE INVENTION

Accordingly, it is an object of the present invention to provide an overlay accuracy measurement mark capable of measuring an overlay accuracy between two selected patterns in a semiconductor device having two or more multi-patterns by only one overlay accuracy measurement mark.

It is another object of the present invention to provide a method for measuring an overlay accuracy between two selected patterns in a semiconductor device having two or more multi-patterns using only one overlay accuracy measurement mark.

To accomplish the above objects, there are provided various overlay accuracy measurement marks. The marks are applied to a semiconductor device comprising a first pattern which is first formed, and second patterns consisting of at least one or more target patterns for alignment with the first pattern, which are formed after the formation of the first pattern.

According to one aspect of the present invention, an overlay accuracy measurement mark includes a first overlay measurement pattern consisting of a plurality of unit measurement marks with a tetragonal through hole in its central portion, said unit measurement marks being spaced by a selected distance from each other in a non-overlapping manner; and a second overlay measurement pattern of a box-shape mark formed in the through hole of the innermost unit measurement mark of the unit measurement marks, wherein each unit mark of said first and second overlay measurement patterns respectively corresponds to said first and second patterns of said semiconductor device.

According to a second aspect of the present invention, an overlay accuracy measurement mark includes a first overlay measurement pattern of a box-shape mark, formed on a scribe line separating a die in which said semiconductor device is formed from a wafer, and corresponding to said first pattern of the semiconductor device; and second overlay measurement patterns consisting of a plurality of box-shape unit measurement marks formed on said first overlay measurement pattern, each of the box-shape unit measurement marks corresponding to the second patterns of the semiconductor device, wherein the book-shape unit measurement marks are stacked one on top of another and on the first overlay measurement pattern such that their areas decrease as the level of the unit measurement marks increases. In the second aspect of the present invention, the unit measurement marks are square as viewed from top of it.

According to a third aspect of the present invention, an overlay accuracy measurement mark includes a first overlay measurement pattern of a box-shape unit measurement mark having a tetragonal through hole in its central portion, corresponding to said first pattern of the semiconductor device; and second overlay measurement patterns formed on the first overlay measurement pattern, consisting of a plurality of box-shape unit measurement marks, each of the box-shape unit measurement marks having a tetragonal through hole in its central portion, and respectively corresponding to the second patterns of the semiconductor device, wherein the box-shape unit measurement marks are stacked one on top of another and on the first overlay measurement pattern and such that areas of the through holes of the first and second overlay measurement patterns decrease as their levels increase.

In addition, to accomplish the above objects of the present invention, there are provided methods for measuring an overlay accuracy using the above-mentioned overlay accuracy measurements marks. The methods are also a semiconductor device comprising a first pattern which is first formed, and second patterns consisting of at least one or more target patterns for alignment with the first pattern, which are formed after the formation of the first pattern.

According to a fourth aspect of the present invention, a method for measuring an overlay accuracy between the first pattern and a selected target pattern of said second patterns, includes the steps of:

forming a first overlay measurement pattern consisting of a plurality of unit measurement marks, each having a tetragonal hole in its central portion, wherein said unit measurement marks are spaced by a selected distance from each other;

forming a second overlay measurement pattern of a box-shape mark within the innermost unit measurement mark of the unit measurement marks, wherein each mark of said first and second overlay measurement patterns respectively corresponds to said first and second patterns of said semiconductor device;

obtaining intervals between two marks corresponding to two selected patterns for alignment in the semiconductor device along positive X-direction, negative X-direction, positive Y-direction, and negative Y-direction;

obtaining a first difference between intervals in positive X-direction and negative X-direction and a second difference between intervals in positive Y-direction and negative Y-direction; and determining an overlay error from a shift X dividing the first difference by two and shift Y dividing the second difference by two.

According to a fifth aspect of the present invention, a method for measuring an overlay accuracy between the first pattern and a selected target pattern of said second patterns, includes the steps of:

forming a first overlay measurement pattern of a box-shape mark on a scribe line separating a die in which said semiconductor device is formed from a wafer, wherein said first overlay measurement pattern corresponds to said first pattern of the semiconductor device;

forming second overlay measurement patterns consisting of a plurality of box-shape unit measurement marks on said first overlay measurement pattern, each of the box-shape unit measurement marks corresponding to the second patterns of the semiconductor device, wherein the box-shape unit measurement marks are stacked on the first overlay measurement pattern such that their areas decrease as the level of the unit measurement marks increases;

obtaining intervals between two marks corresponding to two selected patterns for alignment in the semiconductor device in positive X-direction, negative X-direction, positive Y-direction, and negative Y-direction;

obtaining a first difference between intervals in positive X-direction and negative X-direction and a second difference between intervals in positive Y-direction and negative Y-direction; and determining an overlay error from a shift X dividing the first difference by two and shift Y dividing the second difference by two.

According to a sixth aspect of the present invention, a method for measuring an overlay accuracy between the first pattern and a selected target pattern of said second patterns, includes the steps of:

unit measurement mark having a tetragonal through hole in its central portion, wherein the first overlay measurement pattern corresponds to said first pattern of the semiconductor device;

forming second overlay measurement patterns on the first overlay measurement pattern, wherein said second overlay measurement patterns consist of a plurality of box-shape unit measurement marks, each of the box-shape unit measurement marks having a tetragonal through hole in its central portion, and respectively corresponding to the second patterns of the semiconductor device, and wherein the box-shape unit measurement marks are stacked on the first overlay measurement pattern and such that areas of the through holes of the first and second overlay measurement patterns decrease as their levels increase;

obtaining intervals between two marks corresponding to two selected patterns for alignment in the semiconductor device in positive X-direction, negative X-direction, positive Y-direction, and negative Y-direction;

obtaining a first difference between intervals in positive X-direction and negative X-direction and a second difference between intervals in positive Y-direction and negative Y-direction; and determining an overlay error from a shift X dividing the first difference by two and shift Y dividing the second difference by two.

BRIEF DESCRIPTION OF THE DRAWINGS

These and other features, aspects, and advantages of the present invention will become better understood with reference to the following description, appended claims, and accompanying drawings, wherein

DETAILED DESCRIPTION OF THE INVENTION

Hereinbelow, preferred embodiments will be described with reference to the accompanying drawings.

Figure 3:
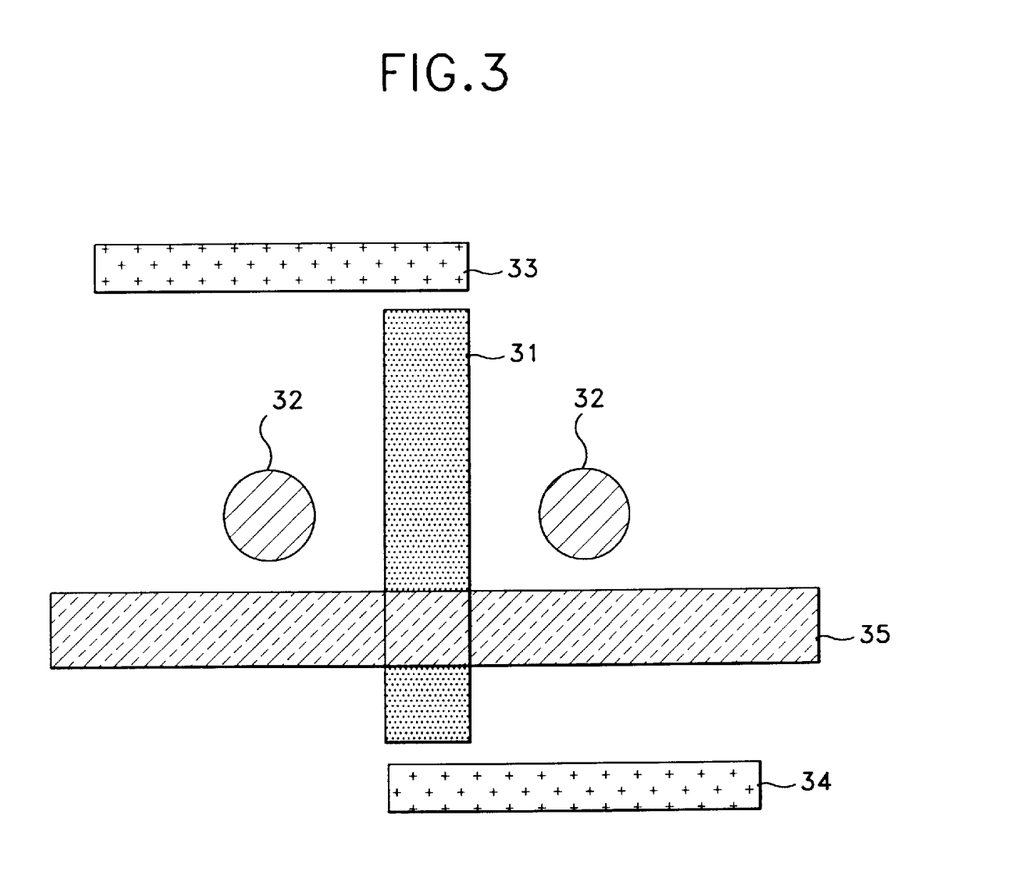
FIG. 3 is a plan view of a semiconductor device having two or more multi-patterns which require an overlay accuracy measurement.
Figure 4:
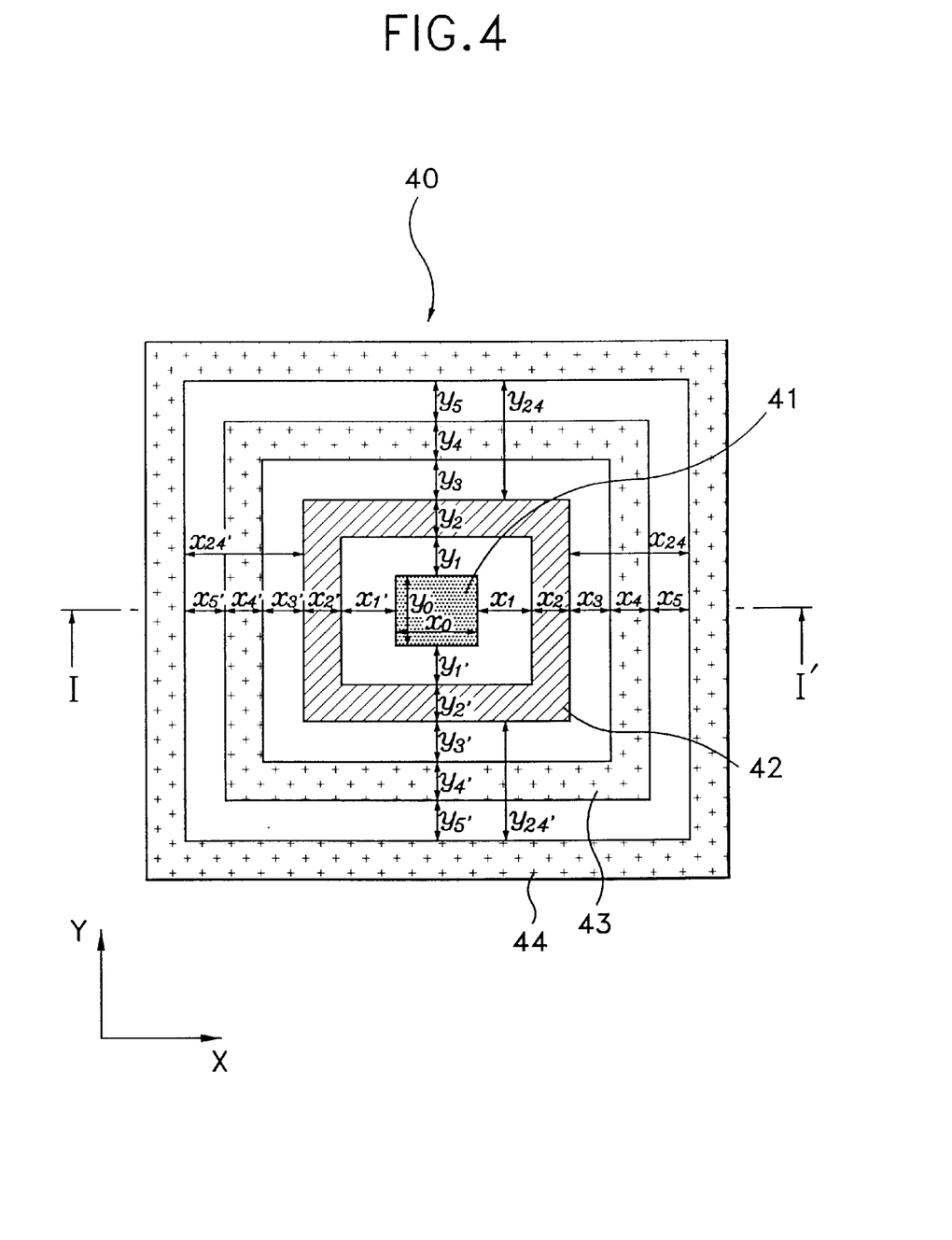
FIG. 4 is a plan view of an overlay accuracy measurement mark in accordance with a first embodiment of the present invention.
Figure 5A:
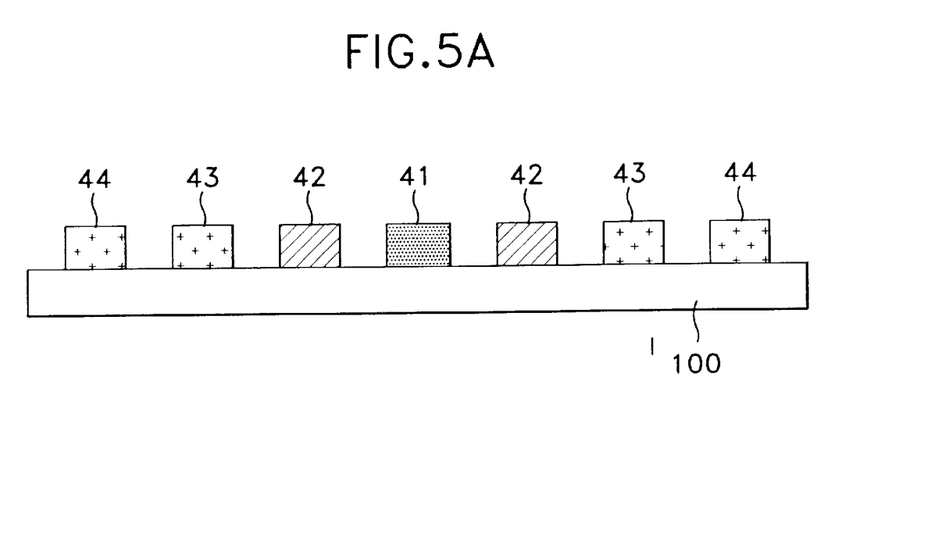
FIGS. 5A and 5B are sectional views taken along the line I-I' of FIG. 4.
Figure 5B:
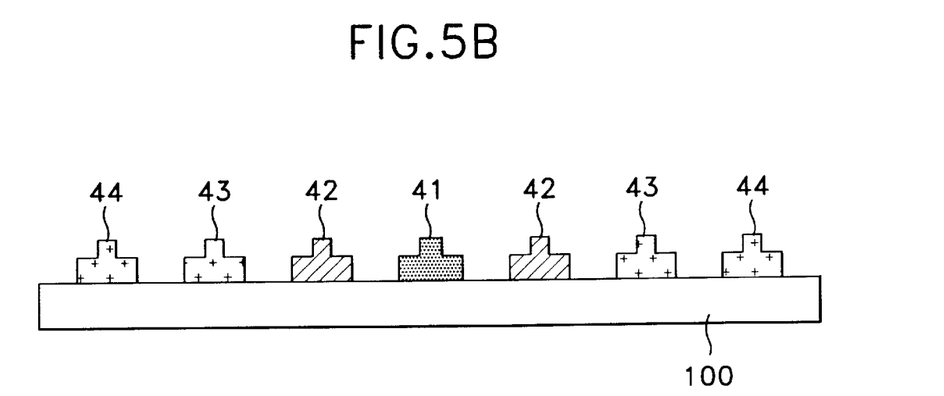

FIG. 3 is a plan view of a semiconductor device having two or more multi patterns which require an overlay accuracy measurement, FIG. 4 is a plan view of an overlay measurement mark in accordance with first embodiment of the present invention, and FIGS. 5A and 5B are sectional views taken along the line I-I' of FIG. 4.

Referring to FIG. 4, there is provided an overlay accuracy measurement mark 40 on a scribe line 100 of a wafer. The mark 40 includes a plurality of unit measurement patterns 41–44. A first group consisting of unit measurement patterns 42–44 are box-shape marks and each has a tetragonal through hole in its central portion, while a second one is a box-shape mark 41, being formed in the through hole of the innermost unit measurement pattern 42 of the first group 42–44. It is preferred that the tetragonal through hole is square. All of the unit measurement patterns 41–44 are formed on the same plane of a scribe line. The unit measurement patterns 41–44 respectively correspond to patterns 31–34 (hereinbelow referred to as "device pattern") of a semiconductor for which an alignment between any two patterns is required. When any two device patterns for alignment among the device patterns 31–34 of FIG. 3 are selected, any one of the unit measurement patterns 41–44 can be made to be a reference pattern which corresponds to a first formed device pattern among the device patterns 31–34. If a device pattern 31 of FIG. 3 is first formed, a mark 41 corresponding to the device pattern 31 becomes the reference pattern.

When the outermost unit measurement pattern 44 corresponding to the device pattern 34 of FIG. 3 is first formed, and second unit measurement pattern 42 spaced from the outermost unit measurement pattern 44 are afterwards formed, an overlay error between the two device patterns 34 and 32 can be obtained from shift X of a displacement in X-direction and shift Y of a displacement in Y-direction shown in the following equation (1).

$$\text{Shift } X = (X_{24} - X_{24}')/2$$

$$\text{Shift } Y = (Y_{24} - Y_{24}')/2 \qquad (1)$$

A coordinate is determined from two lines perpendicularly dividing the first formed unit measurement pattern 44 into two parts in X-direction and Y-direction, and a intersecting point of the two lines. Right handed portion from the intersecting point indicates a positive X-direction, left handed portion from the intersecting point indicates negative X-direction, upper portion from the intersecting point indicates positive Y-direction, and lower portion from the intersecting point indicates negative Y-direction. In equation (1), x24 indicates an interval between the pattern 44 and the pattern 42 in the positive X-direction, x24' indicates an interval between the pattern 44 and the pattern 42 in the negative X-direction, y24 indicates an interval between the pattern 44 and the pattern 42 in the positive Y-direction, and y24' indicates an interval between the pattern 44 and the pattern 42 in the negative Y-direction.

An overlay error between two device patterns 31 and 34 of FIG. 3, is obtained from the equation (1) using the two respective corresponding patterns 41 and 44. Similarly, an overlay error between any two patterns of another unit measurement patterns is also measured by the same method as the above method.

From the shifts X and Y respectively obtained in the X-axis and Y-axis, an alignment state between two patterns of FIG. 3 is determined. For example, if the shifts X and Y are both of 0, it indicates that the two device patterns 31 and 33 are in exact alignment state. If the shift X is positive, and the shift Y is zero, it indicates that the device pattern 33 is shifted only to positive X-direction by a selected distance. If the shift X is positive and the shift Y is negative, it indicates that the device pattern 33 is shifted to positive X-direction and negative Y-direction by respective selected distances.

In the above embodiment, each of spaces x1, x3, x5, y1, y3 and 65 between a plurality of unit measurement patterns 41–44 is 4–6 μm and the unit measurement patterns 42–44 have the width of 4–6 μm, respectively.

FIG. 5A is a sectional view taken along the line I-I' of FIG. 4.

Referring to FIG. 5A, respective unit measurement patterns 41–44 are arranged on the same plane such that they are spaced by a selected interval from each other.

Also, as shown in FIG. 5B, respective unit measurement patterns 41–44 can be formed such that their upper surfaces have a projected portion.

Although the above embodiment shows and describes an alignment between any two patterns among four patterns, the method can be also applied for an alignment between any two patterns of five or more patterns.

Figure 6:
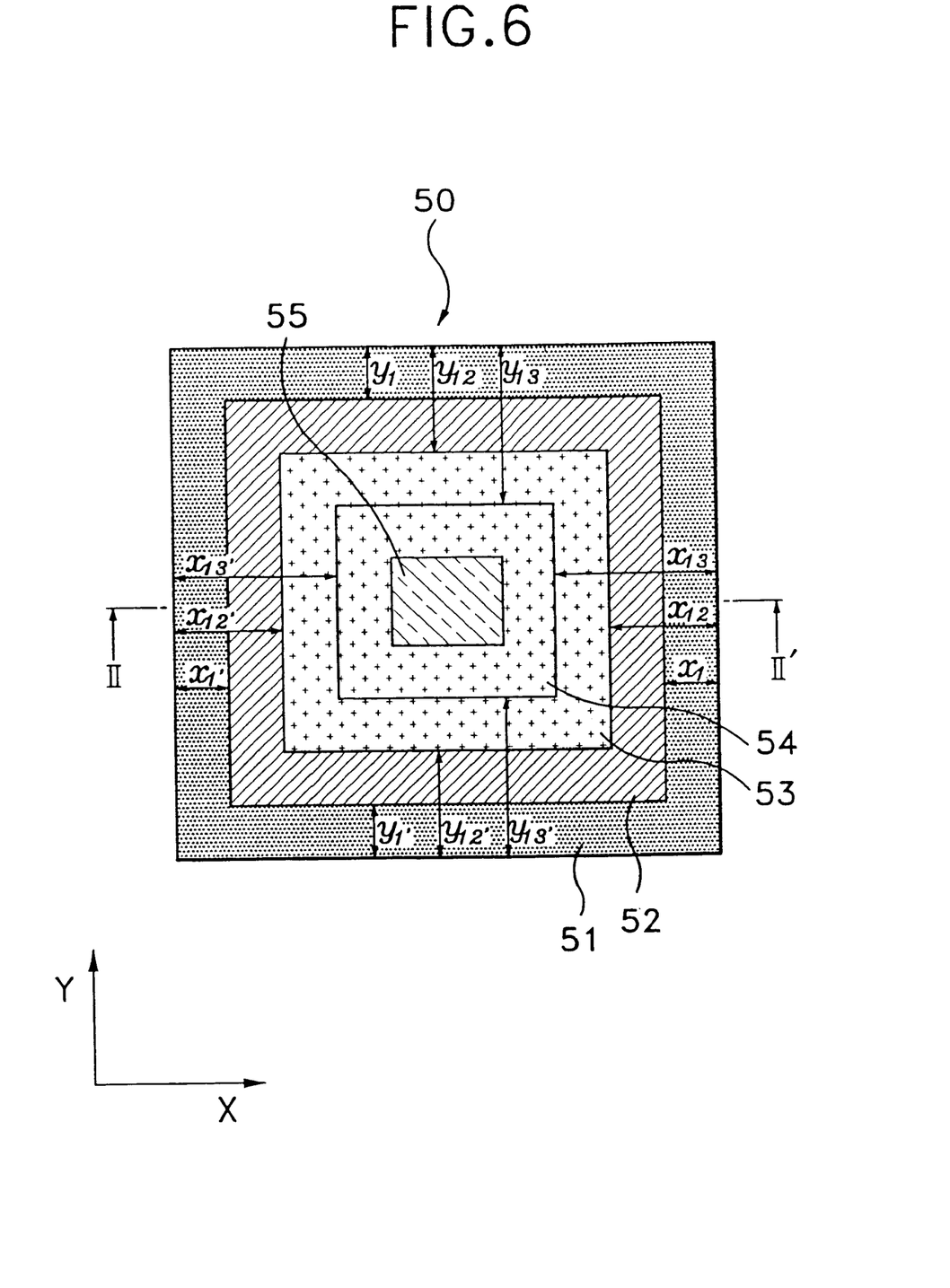
FIG. 6 is a plan view of an overlay accuracy measurement mark in accordance with a second embodiment of the present invention.
Figure 7:
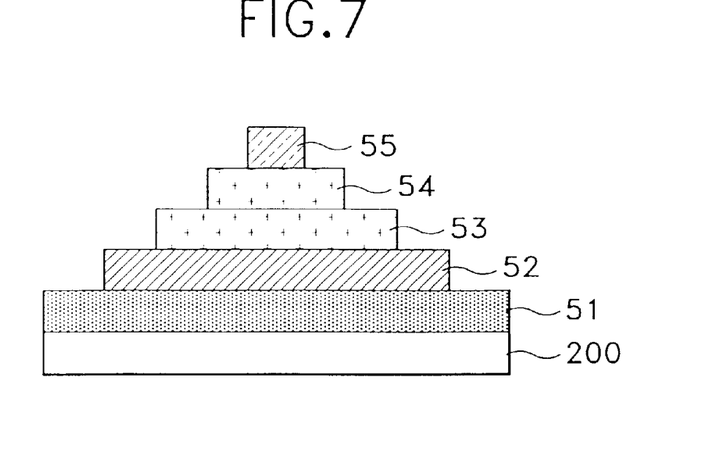
FIG. 7 is a sectional view taken along the line II-II' of FIG. 6.

FIG. 6 is a plan view of an overlay measurement mark in accordance with a second embodiment of the present invention and FIG. 7 is a sectional view taken along the line II-II'.

Referring to FIGS. 6 and 7, there is provided an another overlay accuracy measurement mark 50 on a scribe line 200 of a wafer. The mark includes a plurality of box-shape unit measurement patterns 51–55. The unit measurement patterns 51–55 correspond respectively to the device patterns 31–35 of FIG. 3 and are formed such that their areas decrease as the level of the unit measurement patterns increases, i.e., the overlying mark has smaller area than just underlying pattern, whereby the overlay accuracy measurement pattern 50 has a stacked pyramid structure. It is preferred that each of the overlay measurement patterns 51–55 is square. An unit measurement pattern corresponding to a first formed device pattern is first formed on the scribe line. When the device pattern 31 is first formed and an unit measurement pattern 51 corresponds thereto, the pattern 51 is first formed on the scribe line. Thereafter, device patterns 32–35 are sequentially formed on the semiconductor substrate according to the order of the number, and the patterns 52–55 corresponding to the device patterns 32–35 are also sequentially formed such that their areas decrease, whereby an overlay measurement mark with stacked pyramid structure is formed. In this case, an overlay error between the two device patterns 31 and 33 can be obtained from shift X of a displacement in X-direction and shift Y of a displacement in Y-direction shown in the following equation (2).

$$\text{Shift } X = (x12 - x12')/2$$

$$\text{Shift } Y = (y12 - y12')/2 \qquad (2)$$

A coordinate is determined from two lines perpendicularly dividing the first formed mark 51 by two in X-direction and Y-direction, and a intersecting point of the two lines. Right handed portion from the intersecting point indicates a positive X-direction, left handed portion from the intersecting point indicates negative X-direction, upper portion from the intersecting point indicates positive Y-direction, and lower portion from the intersecting point indicates negative Y-direction. In equation (2), x12 indicates an interval between the unit measurement pattern 51 and the unit measurement pattern 53 in the positive X-direction (equal to a distance from the intersecting point to one end of the pattern 51 in the positive X-direction minus a distance from the intersecting point to one end of the pattern 53 in the positive X-direction), x12' indicates an interval between the pattern 51 and the pattern 53 in the negative X-direction, y12 indicates an interval between the pattern 51 and the pattern 53 in the positive Y-direction, and y12' indicates an interval between the mark 51 and the mark 53 in the negative Y-direction.

From the shifts X and Y respectively obtained in the X-axis and Y-axis, an alignment state between two patterns of FIG. 3 is determined. For example, if the shifts X and Y are both of 0, it indicates that the two device patterns 31 and 33 are in exact alignment state. If the shift X is positive, and the shift Y is zero, it indicates that the pattern 33 is shifted only to positive X-direction by a selected distance. If the shift X is positive and the shift Y is negative, it indicates that the pattern 33 is shifted to positive X-direction and negative Y-direction by respective selected distances.

It is preferred that the unit measurement patterns 51–55 of the overlay measurement mark 50 are square as viewed from top of the mark 50, and that their one side lengths should be allowed to have a range of 50–100 $\mu$m. Also, it is preferred that an interval between adjacent two marks is allowed to have a range of 2–$\mu$m.

Although the above embodiment shows and describes an alignment between any two patterns of five patterns, the method can be also applied to an alignment between any two patterns of six or more patterns.

Figure 8:
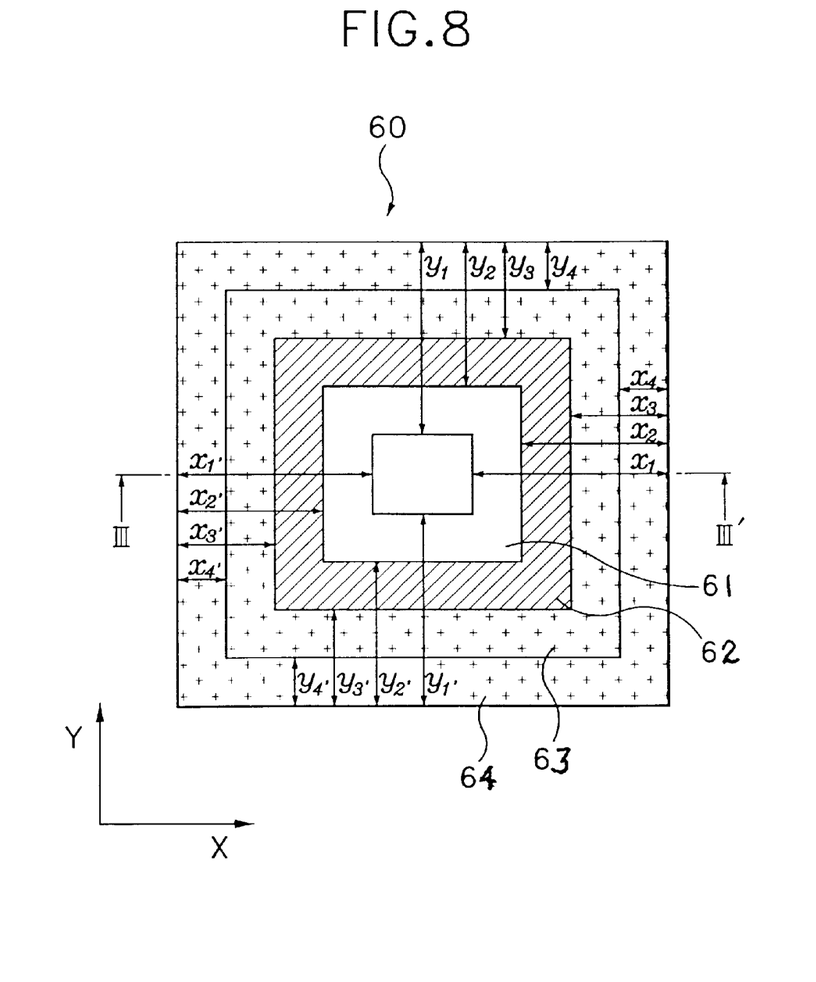
FIG. 8 is a plan view of an overlay accuracy measurement mark in accordance with a third embodiment of the present invention.
Figure 9:
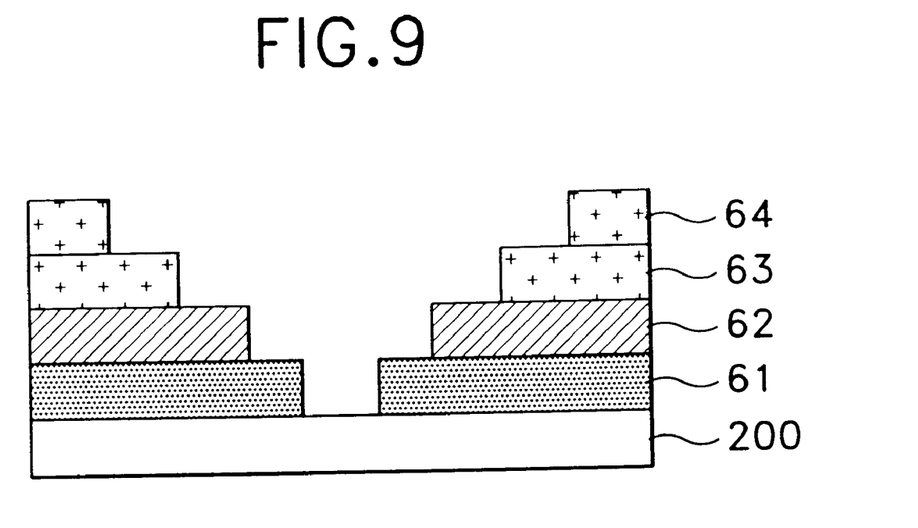
FIG. 9 is a sectional view taken along the line III-III' of FIG. 8.

FIG. 8 is a plan view of an overlay accuracy measurement mark in accordance with a third embodiment of the present invention and FIG. 9 is a sectional view taken along the line III-III'.

Referring to FIGS. 8 and 9, there are provided still another overlay measurement mark 60 on a scribe line 200 of a wafer. The mark 60 includes four unit measurement patterns 61–64 of a box shape, each having a tetragonal through hole in its central portion as viewed from top of the mark 60. Since respective unit measurement patterns corresponding to the patterns 31–34 of FIG. 3, are formed such that they are sequentially stacked depending on the forming order of the corresponding patterns. As a result, their through holes have an upset pyramid structure that an area of the through hole of the lastly formed unit measurement pattern 64 is the largest and an area of the through hole of the first formed pattern 61 is the smallest. In the above embodiment, the unit measurement pattern 61 is first formed since it corresponds to the device pattern 31.

In this case, an overlay error between the two patterns 31 and 33 can be obtained from shift X of a displacement in X-direction and shift Y of a displacement in Y-direction shown in the following equation (3).

$$\text{Shift } X = [(x1-x3)-(x1'-x3')]/2$$

$$\text{Shift } Y = [(y1-y3)-(y1'-y3')]/2 \qquad (3)$$

A coordinate is determined from two lines perpendicularly dividing the first formed mark 61 into two parts in X-direction and Y-direction, and a intersecting point of the two lines. Right handed portion from the intersecting point indicates a positive X-direction, left handed portion from the intersecting point indicates negative X-direction, upper portion from the intersecting point indicates positive Y-direction, and lower portion from the intersecting point indicates negative Y-direction. In equation (3) and FIG. 9, x1–x3 indicates a difference between a width of the unit measurement pattern 61 and a width of the unit measurement pattern 63 respectively in the positive X-direction, $x_1'-x_3'$ indicates a difference between a width of the mark 61 and a width of the mark 63 respectively in the negative X-direction, $y_1-y_3$ indicates a difference between a width of the unit measurement pattern 61 and a width of the unit measurement pattern 63 respectively in the positive Y-direction, and $y_1'-y_3'$ indicates a difference between a width of the unit measurement pattern 61 and a width of the unit measurement pattern 63 respectively in the negative Y-direction.

From the shifts X and Y respectively obtained in the X-axis and Y-axis, an alignment state between two device patterns of FIG. 3 is determined. For example, if the shifts X and Y are both of 0, it indicates that the two patterns 31 and 33 are in exact alignment state. If the shift X is positive, and the shift Y is zero, it indicates that the pattern 33 is shifted only to positive X-direction by a selected distance. If the shift X is positive and the shift Y is negative, it indicates that the pattern 33 is shifted to positive X-direction and negative Y-direction by respective selected distances.

Meanwhile, although the above embodiment shows and describes an alignment between any two patterns of four patterns, the method can be also applied to an alignment between any two patterns of five or more multi-patterns.

Figure 10:
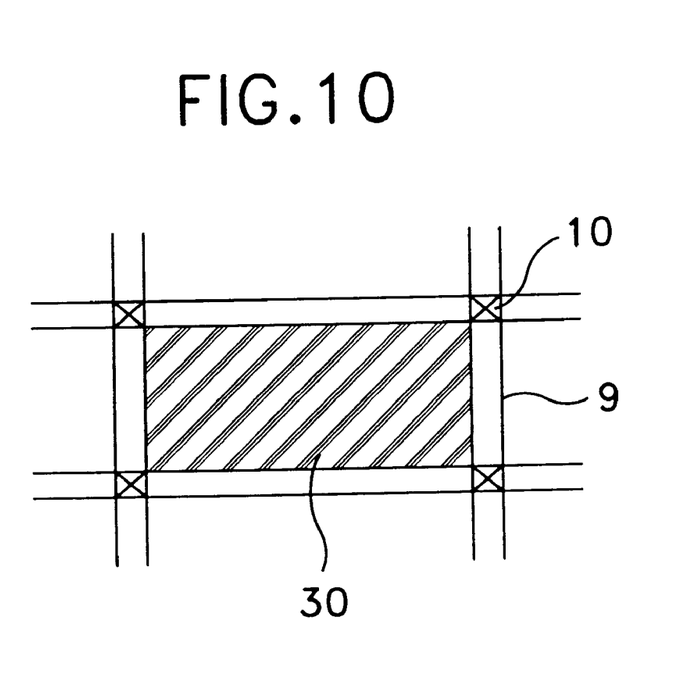
FIG. 10 is a schematic diagram showing the arrangement positions of overlay measurement marks in accordance with the present invention.

FIG. 10 shows arranged positions of the overlay measurement marks 10 on scribe lines 9 of a wafer. The overlay measurement marks 10 are positioned at respective intersecting points of scribe lines 9 for dividing the wafer into one product die 30. Therefore, when the overlay measurement is required, user can measure the overlay accuracy by detecting and analyzing the overlay measurement marks 10 on the scribe line 9.

As described previously, the present invention makes it possible to measure the overlay error between any selected two patterns among multi patterns only using an unit pattern needless of forming an additional overlay measurement mark whenever an alignment between any selected two patterns is required. As a result, the mark does not need a space for the additional device patterns. Moreover, the marks does not need a measurement program to measure an overlay error between multi patterns because the conventional overlay measurement method used in measuring an overlay error between two device patterns can be also applied to the overlay measurement marks provided in the present invention.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be affected without departing from the spirit and scope of the invention as described and claimed.

What is claimed is:

1. A mark for measuring an overlay accuracy between a first pattern which is one of at least three target patterns formed during manufacture of a semiconductor device and a second pattern which is another one of the target patterns and formed after the formation of the first pattern, the mark comprising:

a first overlay measurement pattern consisting of a plurality of unit measurement marks with a tetragonal through hole in a central portion, wherein no two tetragonal holes are the same size, and wherein said unit measurement marks being spaced by a selected distance from each other in a non-overlapping manner; and a second overlay measurement pattern of a box-shape mark formed in the through hole of the innermost unit measurement mark of the unit measurement marks, wherein each unit mark of said first and second overlay measurement patterns respectively corresponds to said first and second patterns of said semiconductor device.

2. The overlay accuracy measurement mark as claimed in claim 1, wherein said each unit mark of said first and second overlay measurement patterns has a portion projected from its upper surface.

3. The overlay measurement mark as claimed in claim 1, wherein an interval between two adjacent unit measurement marks and widths of the unit measurement marks of said first overlay measurement mark are 4–6 $\mu$m, respectively.

4. A mark for measuring an overlay accuracy between a first pattern which is one of at least three target patterns formed during manufacture of a semiconductor device and a second pattern which is another one of the target patterns and formed after the formation of the first pattern, the mark comprising:

a first overlay measurement pattern of a box-shape mark, formed on a scribe line separating a die in which said semiconductor device is formed from a wafer, and corresponding to said first pattern of the semiconductor device; and second overlay measurement patterns consisting of a plurality of box-shape unit measurement marks formed on said first overlay measurement pattern, each of the box-shape unit measurement marks corresponding to the second patterns of the semiconductor device, wherein the box-shape unit measurement marks are stacked one on top of another and on the first overlay measurement pattern such that their areas decrease as the level of the unit measurement marks increases.

5. The overlay measurement mark as claimed in claim 4, wherein said unit measurement marks are square.

6. The overlay measurement mark as claimed in claim 5, wherein one side length of said unit measurement mark is 50–100 $\mu$m.

7. The overlay measurement mark as claimed in claim 6, wherein intervals between two adjacent patterns for alignment in the semiconductor device along a positive X-direction, a negative X-direction, a positive Y-direction, and a negative Y-direction are 2–5 $\mu$m.

8. A mark for measuring an overlay accuracy between a first pattern which is one of at least three target patterns formed during manufacture of a semiconductor device and a second pattern which is another one of the target patterns and formed after the formation of the first pattern, the mark comprising:

a first overlay measurement pattern of a box-shape unit measurement mark having a tetragonal through hole in its central portion, and wherein no two tetragonal holes are the same size, corresponding to said first pattern of the semiconductor device; and second overlay measurement patterns formed on the first overlay measurement pattern, consisting of a plurality of box-shape unit measurement marks, each of the box-shape unit measurement marks having a tetragonal through hole in its central portion, and respectively corresponding to the second patterns of the semiconductor device, wherein the box-shape unit measurement marks are stacked on the first overlay measurement pattern and such that areas of the through holes of the first and second overlay measurement patterns decrease as their levels increase.

9. The overlay measurement mark as claimed in claim 8, wherein said through holes are square.

* * * * *

UNITED STATES PATENT AND TRADEMARK OFFICE
CERTIFICATE OF CORRECTION

PATENT NO :   6,063,529
DATED     :   May 16, 2000
INVENTOR(S):  J. Hwang

It is certified that error appears in the above-identified patent and that said Letters Patent are hereby corrected as shown below:

At col. 2, line 65, please cancel "book-shape" and substitute --box-shape-- therefor.

At col. 7, please cancel "2-$\mu$m" and substitute --2-5$\mu$m-- therefor.

Signed and Sealed this

Seventeenth Day of April, 2001

NICHOLAS P. GODICI

Attest:

Attesting Officer

Acting Director of the United States Patent and Trademark Office